United States Patent [19]
Schwalke

[11] Patent Number: 6,057,211
[45] Date of Patent: May 2, 2000

[54] METHOD FOR MANUFACTURING AN INTEGRATED CIRCUIT ARRANGEMENT

[75] Inventor: Udo Schwalke, Heldenstein, Germany

[73] Assignee: Siemens Aktiengesellschaft, Munich, Germany

[21] Appl. No.: 08/990,516

[22] Filed: Dec. 15, 1997

[30] Foreign Application Priority Data

Dec. 18, 1996 [DE] Germany .................... 196 52 853

[51] Int. Cl.[7] .................................................. H01L 21/76
[52] U.S. Cl. .................... 438/428; 428/698; 428/699; 428/702; 428/296; 428/427; 428/436; 428/437
[58] Field of Search .................... 438/760, 761, 438/763, 697, 698, 699, 700, 702, 703, 706, 735, 424, 427, 428, 435, 436, 437, 438, 902, 981, 294, 296, 787

[56] References Cited

U.S. PATENT DOCUMENTS

| | | | |
|---|---|---|---|
| 4,404,735 | 9/1983 | Sakurai | 438/359 |
| 4,532,701 | 8/1985 | Kameyama et al. | |
| 4,965,226 | 10/1990 | Gootzen et al. | |
| 5,175,122 | 12/1992 | Wang | 438/427 |
| 5,488,007 | 1/1996 | Kim et al. | |
| 5,643,836 | 7/1997 | Meister | 438/239 |

FOREIGN PATENT DOCUMENTS

| | | | |
|---|---|---|---|
| 0 637 071 A2 | 1/1995 | European Pat. Off. | |
| 0637071A2 | 2/1995 | European Pat. Off. | 21/76 |
| WO 97/38442 | 10/1997 | WIPO | 21/76 |

OTHER PUBLICATIONS

Forming Wide Trench Dielectric Isolation by P.J. Tsang, IBM Technical Disclosure Bulletin, vol. 25, No. 11B, Apr. 1983.

Method for Planarizing Over Shallow Trenches Filled with Silicon Dioxide, IBM Technical Disclosure Bulletin, vol. 32, No. 9A, Feb. 1990.

A New Planarization Technique, Using a Combination of RIE and Chemical Mechanical Polish (CMP) by B. Davari et al., IBM Research, et al. IEEE 1989.

A Novel Global Planarization Technology Using Defocused Resist Patterning with Blanket Stripe Mask (DRESS), by Y. Matsubara et al. ULSI Device Development Laboratories, IEEE 1993.

Patent Abstracts of Japan–02143461–Jan. 6, 1990.
Patent Abstracts of Japan–01030243–Jan 2, 1989.

*Primary Examiner*—Charles Bowers
*Assistant Examiner*—Nema Berezny
*Attorney, Agent, or Firm*—Hill & Simpson

[57] ABSTRACT

In a method for manufacturing an integrated circuit arrangement, trenches that define active zones are formed in a substrate. A first insulating layer that fills the narrow trenches is conformally deposited and is structured with a mask and anisotropic etching such that spacers arise at sidewalls of the wide trenches and supporting locations arise in a region of the wide trenches. The surface of the active zones is uncovered by forming a second insulating layer with an essentially planar surface and by a planarizing layer erosion on the basis of chemical-mechanical polishing or conventional dry etching.

10 Claims, 6 Drawing Sheets

METHOD FOR MANUFACTURING AN INTEGRATED CIRCUIT ARRANGEMENT

BACKGROUND OF THE INVENTION

Insulation structures that insulate neighboring, active regions in the semiconductor substrate from one another are formed in the manufacture of integrated circuit arrangements in semiconductor substrates. What are referred to as shallow trench insulations are being increasingly employed in LSI circuits. These are thereby trenches that are filled with insulating material, usually oxide. A planarization is implemented wherein the surface of the active regions is uncovered and the surfaces of the oxide fills are maintained at approximately the same height as the surface of the active regions. The planarization in the manufacture of shallow trench insulations usually occurs with chemical-mechanical polishing.

Since the width of the insulation structures in integrated circuits is usually not constant over the entire integrated circuit, insulating trenches of different widths are formed in shallow trench insulation. Beyond this, the thickness of active regions and insulating trenches fluctuates highly. This leads to difficulties in the planarization, so that the surface that derives also exhibits steps after the planarization that are often referred to as topology steps.

In order to avoid topology steps in planarization with chemical-mechanical polishing, it has been proposed to employ an additional lacquer planarization mask (see B. Davari et al, IEDM Tech. Digest, p. 61 (1989)). After deposition of an insulating layer that is employed for filling the trenches, supporting locations of lacquer are thereby formed in wide trenches. Subsequently, a further lacquer layer is applied in surface-wide fashion, this exhibiting an essentially planar surface due to flowing. Proceeding from this planar surface, the planarization is implemented by chemical mechanical polishing until the surface of the active regions is uncovered. The supporting locations of lacquer and the further lacquer layer are thereby removed. The supporting locations of lacquer must be tempered so that the supporting locations of lacquer are not attacked upon application of the further lacquer. This tempering occurs at temperatures of 180° C. and partly leads to a modification of the shape of the lacquer supporting locations due to flowing. The planarization is deteriorated as a result thereof.

Y. Matsubara et al., IEDM Tech. Digest, p. 665 (1993) has proposed a further method for planarizing multi-layer metal wirings wherein strip-shaped supporting structures of photoresist are formed on an insulating layer that covers a metallization level. By targeted exposure in regions in which the metallization level exhibits few lines, the strip-shaped supporting structures are formed mainly in these regions. A second lacquer layer is applied and planarized in surface-wide fashion above the supporting structures.

SUMMARY OF THE INVENTION

It is an object of the invention to specify a method for manufacturing an integrated circuit arrangement that is suitable for the manufacture of shallow trench insulations and with which an improved planarization is achieved, even over global topology steps.

According to the method of the invention for manufacturing an integrated circuit arrangement, a first insulating trench and a second insulating trench are etched at a principal surface of a semiconductor substrate so as to divide active regions, the first insulating trench having less of a width than a width of the second insulating trench. A first insulating layer is formed with substantially conformal edge coverage to substantially fill the first insulating trench. A mask is formed that has an opening above the first insulating trench and above the active regions. The opening arranged above the active regions laterally overlaps the active regions. The first insulating layer is structured by anisotropic etching so that a supporting structure is formed above the second insulating trench and such that a spacer is formed at a sidewall of the second trench. The mask is then removed and a second insulating layer is formed having a substantially planar surface over the structured first insulating layer. Thereafter, the principal surface is uncovered at a top of the active regions by a planarizing layer erosion.

With the invention, the first insulating trenches and the second insulating trenches are etched in the principal surface of the semiconductor substrate which is preferably of a monocrystalline silicon wafer or the monocrystalline silicon layer of a SOI substrate. The first insulating trenches and the second insulating trenches define the active regions.

The first insulating trenches have a lower width than the second insulating trenches. The widths of various first insulating trenches as well as various second insulating trenches can thus differ from one another.

The first insulating layer is formed with essentially conformal edge coverage, the thickness thereof being dimensioned such that it essentially fills the first insulating trenches.

Subsequently, the mask is formed that has openings above the first insulating trenches and above the active regions, whereby the openings arranged above the active regions laterally overlap the active regions. Subsequently, the first insulating layer is structured by anisotropic etching upon employment of the mask as an etching mask. The supporting structures are thus formed above the second insulating trenches. Spaces are formed at the sidewalls of the second insulating trenches. After removal of the mask, the second insulating layer having an essentially planar surface is formed. Subsequently, the principal surface is uncovered in the region of the active zones on the basis of a planarizing layer erosion.

In this method, supporting structures that are formed in the region of the second insulating trenches in order to avoid global topology steps are formed of the material of the first insulating layer. These supporting structures, as well as the spacers simultaneously formed at the sidewalls of the second trenches, also remain as insulation material after the planarizing layer erosion in the second insulating trenches. Since the supporting structures and the spacers only partially fill the second insulating trenches, irregularities a width of which however, is predetermined by the overlap of the openings of the mask over the active zones, remain in the surface of the structure in the region of the second insulating trenches after removal of the mask. These irregularities therefore exhibit substantially the same width over the entire substrate, so that they can be filled without further steps in the formation of the second insulating layer.

The openings of the mask preferably laterally overlap the active zones by a distance that is at least as great as the thickness of the first insulating layer. It is thus assured that spacers are created at the sidewalls of the second insulating trenches and that the supporting structures are created separated therefrom.

The planarizing layer erosion, wherein the principal surface in the region of the active zones is uncovered, can occur both by chemical-mechanical polishing as well as by conventional anisotropic dry etching. It is advantageous in view of a process simplification to implement the planarizing layer erosion by anisotropic dry etching.

The first insulating layer is preferably formed of $SiO_2$ in a TEOS process. Alternatively, the first insulating layer can be formed of all insulating materials that, on the one hand, can be conformally deposited and that, on the other hand, are suitable as a fill for insulating trenches in view of their dielectric constant, their temperature stability, preferably above 500° C., and their mechanical properties.

It lies within the scope of the invention to form a gate dielectric and a first electrode layer on the principal surface of the semiconductor substrate before the etching of the first insulating trenches and of the second insulating trenches. The gate dielectric and the first electrode layer are then structured in the etching of the first insulating trenches and of the second insulating trenches. The surface of the structured, first electrode layer is uncovered in the planarizing layer erosion. Subsequently, a gate electrode is formed from the structured, first electrode layer and source/drain zones laterally therefrom.

This embodiment of the invention has the advantage that the process steps of forming a gate dielectric and an electrode layer for a gate electrode that are critical with respect to the cleanliness demands in the manufacture of a MOS transistor occur before the formation of the first insulating trenches and second insulating trenches and their filling upon employment of planarization steps. The active regions—which also include the structured gate dielectric and the structured, first electrode layer in this case—are surrounded by the material of the first insulating layer after the structuring of the first insulating layer. Materials that cannot be employed in a process environment in which the gate dielectric and gate electrode are formed because of their purity can be utilized for the second insulating layer that subsequently partly contributes to filling the second insulating trenches. In particular, it lies within the framework of the invention to form the second insulating layer of a flowable oxide, for example BPSG or the like.

It also lies within the scope of the invention to form a second electrode layer after the planarizing structuring. The second electrode layer and the first electrode layer are structured upon employment of a common mask, whereby gate electrodes are formed of the first electrode layer and a line level that has gate lines within gate electrodes is formed from the second electrode layer. It thus lies within the scope of the invention to differently dope the structured, first electrode layer before the formation of the second electrode layer in order to manufacture n-channel MOS transistors and p-channel MOS transistors with differently doped gate electrodes. A dopant diffusion between differently doped regions of the first electrode layer is avoided in this way.

DESCRIPTION OF THE PREFERRED EMBODIMENT

Figure 1:
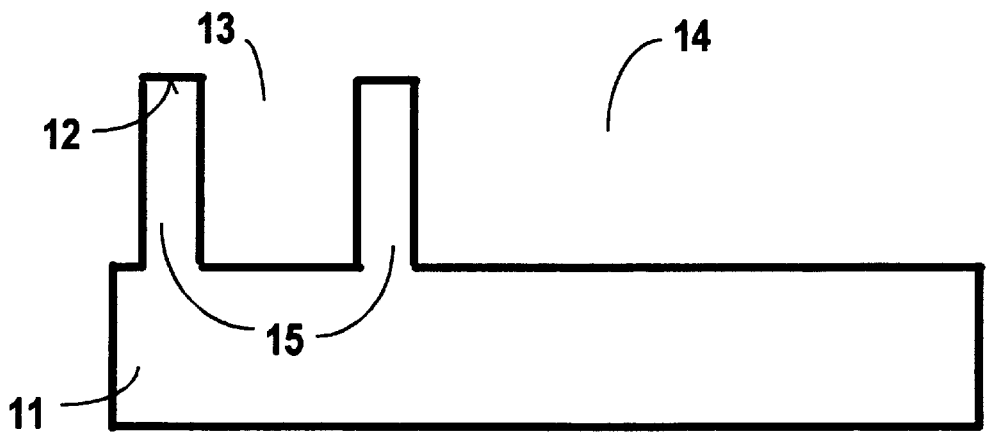
FIG. 1 shows a section through a semiconductor substrate after the etching of first insulating trenches and second insulating trenches of different width.

First insulating trenches 13 and second insulating trenches 14 are etched in the principal surface 12 of a substrate 11 (see FIG. 1).

For example, the substrate 11 is a monocrystalline silicon wafer or the monocrystalline silicon layer of a SOI substrate. The first insulating trenches 13 and the second insulating trenches 14 are formed in an anisotropic dry-etching process, for example with $CL_2$/HBr chemistry, upon employment of a trench mask (not shown). The first trenches 13 have a width of, for example, 0.5 $\mu$m; and the second trenches 14 have a width of, for example, 40 $\mu$m. The first trenches 13 and the second trenches 14 have a depth of, for example, 400 nm. The first insulating trenches 13 and the second insulating trenches 14 define active regions 15 in which components are manufactured later.

Figure 2:
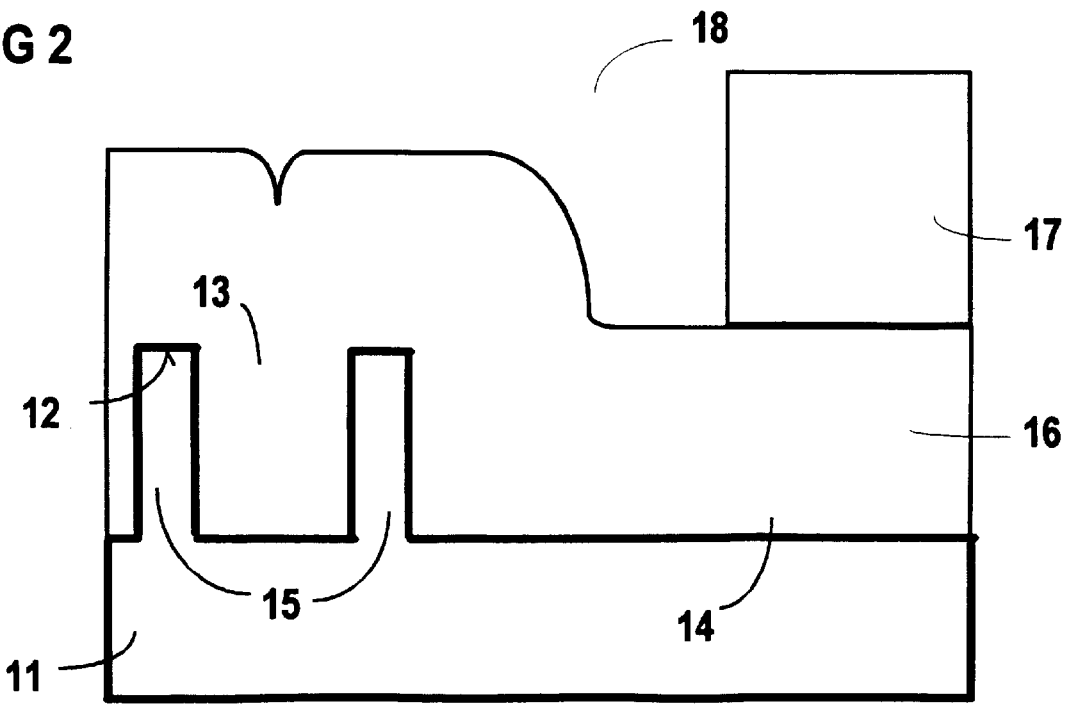
FIG. 2 shows a section through the semiconductor substrate after formation of a first insulating layer with conformal edge coverage and a mask.

Subsequently, a first insulating layer is deposited in surface-wide fashion with conformal edge coverage (see FIG. 2). The first insulating layer 16 of $SiO_2$ is deposited in a layer thickness of, for example, 450 nm, for example in a TEOS process. The first insulating layer 16 fills the first insulating trenches 13. By contrast thereto, the first insulating layer 16 exhibits a clear step in the region of the second insulating trenches 14.

The mask 17, for example of photoresist, is formed on the surface of the first insulating layer 16 with the assistance of a photolithographic process step. The mask 17 has openings 18 that are arranged above the first insulating trenches 13 and the active regions 15. Openings 18 neighboring one another thus coincide. Openings 18 arranged above the active regions 15 thus laterally project beyond the active region 15, so that the openings 18 are thus also partially arranged above the second insulating trenches 14. The amount by which the openings 18 laterally project beyond the active regions 15 is preferably at least as large as the thickness of the first insulating layer 16 (FIG. 2 shows only one opening 18 that is arranged by the two active regions 15 and above the first insulating trench 13).

Figure 3:
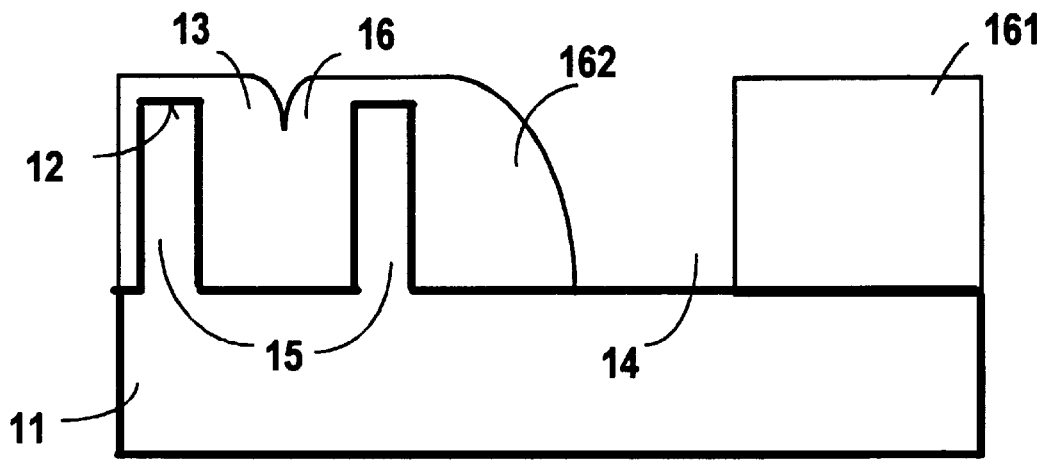
FIG. 3 shows a section through the semiconductor substrate after structuring of the first insulating layer for forming supporting structures and spacers and removal of the mask.

Upon employment of the mask 17 as an etching mask, the first insulating layer 16 is etched selectively relative to the mask 17 and the substrate 11 in an anisotropic dry-etching process. Supporting structures 161 thus arise in the region of the second insulating trenches 14 and spacers 162 of the first insulating layer 16 thus arise at the sidewalls of the second insulating trenches 14 (see FIG. 3). The first insulating trenches 13 remain filled with the first insulating layer 16.

The mask 17 is subsequently removed, for example, wet-chemically with an organic solvent.

A thermal oxidation is subsequently implemented, whereby uncovered silicon, for example the uncovered surface of the substrate 11 in the region of the second insulating trenches outside the supporting structures 161 and the spacers 162, form a $SiO_2$ structure 19.

Figure 4:
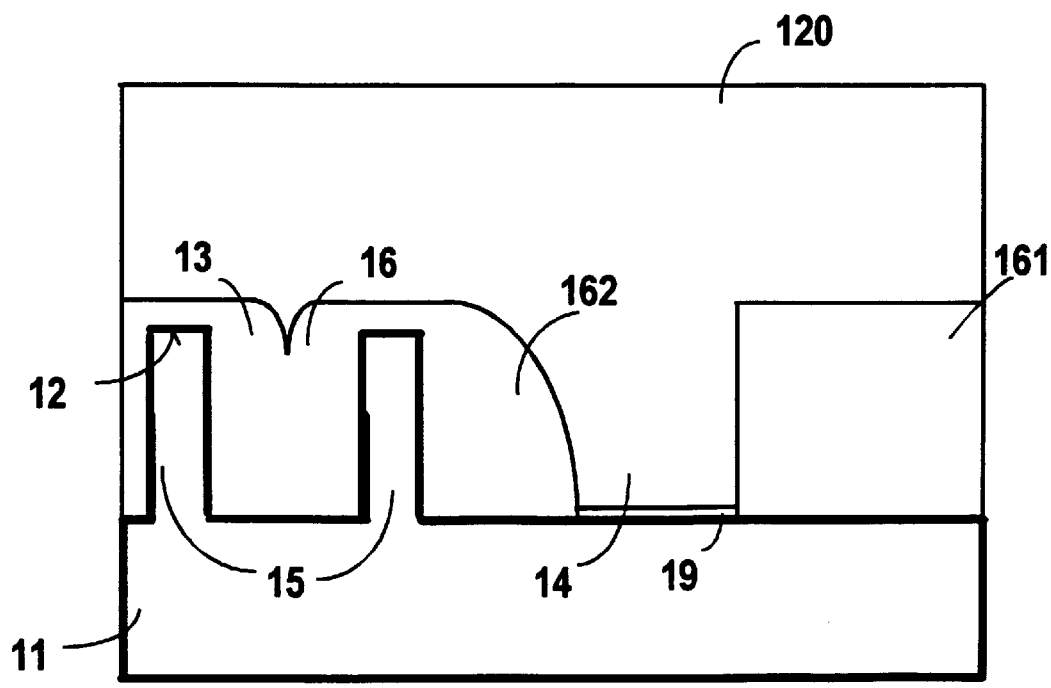
FIG. 4 shows the semiconductor substrate after formation of a second insulating layer with a planar surface.

A second insulating layer 120 is formed that comprises a planar surface (see FIG. 4). The second insulating layer 120 is formed, for example, of $SiO_2$ that can be flowed in a tempering process. In particular, silicate glasses, for example borophosphorous silicate glass, phosphorous silicate glass, borosilicate glass and flowable oxides of the type offered by Dow Corning under the name FOX™, are suitable. The second insulating layer 120 is deposited in a thickness of, for example, 500 nm and is subsequently subjected to a tempering process at about 950° C. The second insulating layer 120 thus flows such that a planar surface forms.

Figure 5:
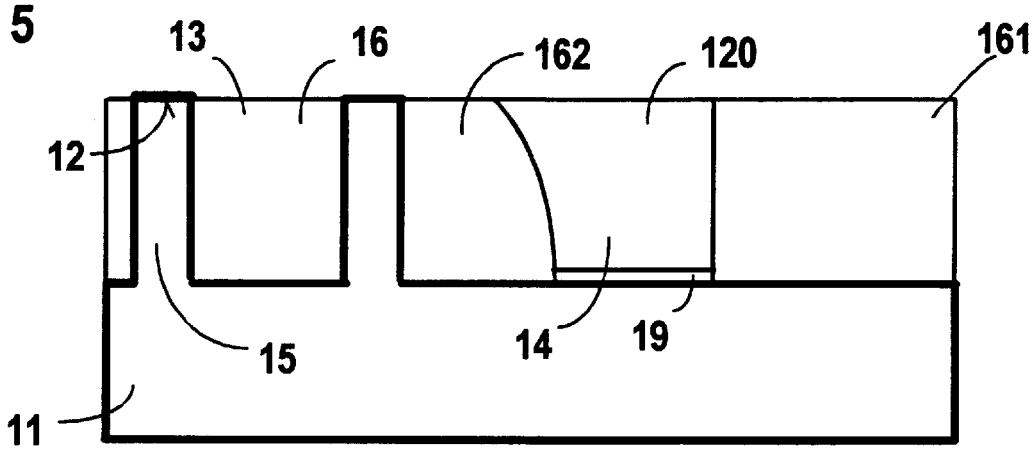
FIG. 5 shows a section through the semiconductor substrate after a planarizing layer erosion wherein the principal surface was uncovered in the region of the active zones.

An anisotropic dry-etching process that etches $SiO_2$ selectively relative to silicon is subsequently implemented. A planarizing erosion occurs with the assistance of this anisotropic dry-etching process. The dry-etching is continued until the principal surface 12 is uncovered in the region of the active zones 15 (see FIG. 5). Since the surface of the second insulating layer 120 was planar, a structure having a planar surface results after the anisotropic dry-etching process. The first insulating trenches 13 and the second insulating trenches 14 are filled with insulating material.

The planarizing etching erosion can also be alternatively implemented by chemical-mechanical polishing or CMP in combination with a dry-etching process. The erosion is implemented down to the principal surface 12.

The process for manufacturing components in the region of the active zones 15 is subsequently continued.

Figure 6:
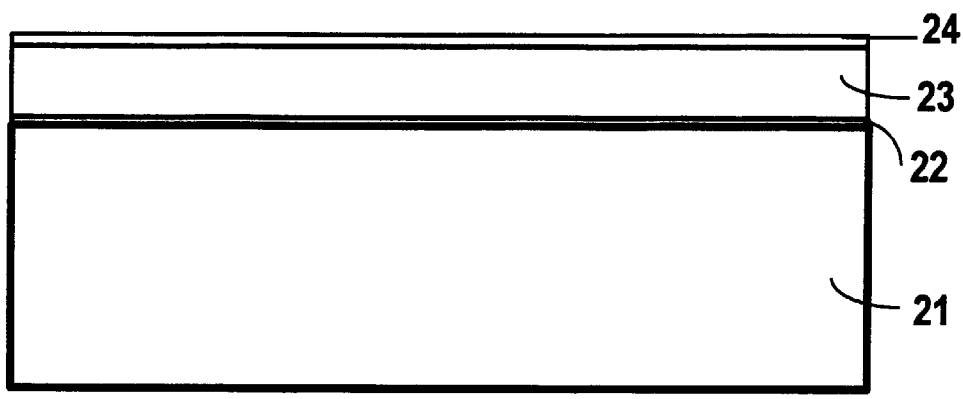
FIG. 6 shows a section through a semiconductor substrate with a layer sequence that has a gate dielectric and a first electrode layer.
Figure 7:
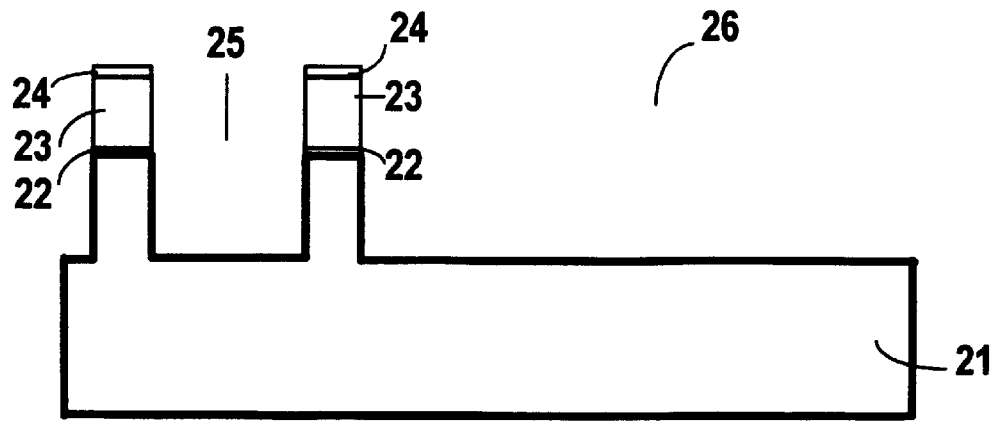
FIG. 7 shows a section through the semiconductor substrate after formation of first insulating trenches and second insulating trenches.

A gate dielectric 22, a first electrode layer 23 and a cover layer 24 are applied onto a semiconductor substrate 21 (see FIG. 6). The substrate 21 comprises monocrystalline silicon. For example, it is a matter of a monocrystalline silicon wafer or of the monocrystalline layer of a SOI substrate. The gate dielectric 22 is formed of $SiO_2$ in a layer thickness of, for example 6 nm, for example by thermal oxidation. The first electrode layer 23 is formed, for example, of doped polysilicon in a layer thickness of 200 nm. The cover layer 24 is formed, for example, of $Si_3N_4$ or $SiO_2$ in a layer thickness of 50 to 150 nm.

The cover layer 24 is structured upon employment of photolithographic process steps and of a dry-etching process. Subsequently, first insulating trenches 25 and second insulating trenches 26 that extend into the substrate 21 are etched in an anisotropic dry-etching process, for example, with $Cl_2$/Hbr. The cover layer 24 thereby protects the surface of the first electrode layer 23. The first insulating trenches 25 exhibit less of a width than the second insulating trenches 26. The first insulating trenches 25 and the second insulating trenches 26 define active zones 27 in which components are subsequently manufactured. The first trenches 25 have a width of, for example, 0.5 $\mu$m; and the second trenches 26 has a width of, for example, 40 $\mu$m. The first trenches 25 and the second trenches 26 have a depth of, for example, 400 nm with reference to the upper edge of the first electrode layer 23. A thermal oxidation can be implemented for improving the etched Si surfaces (etch damage) and for the formation of a bird's bill at the upper trench edge.

Figure 8:
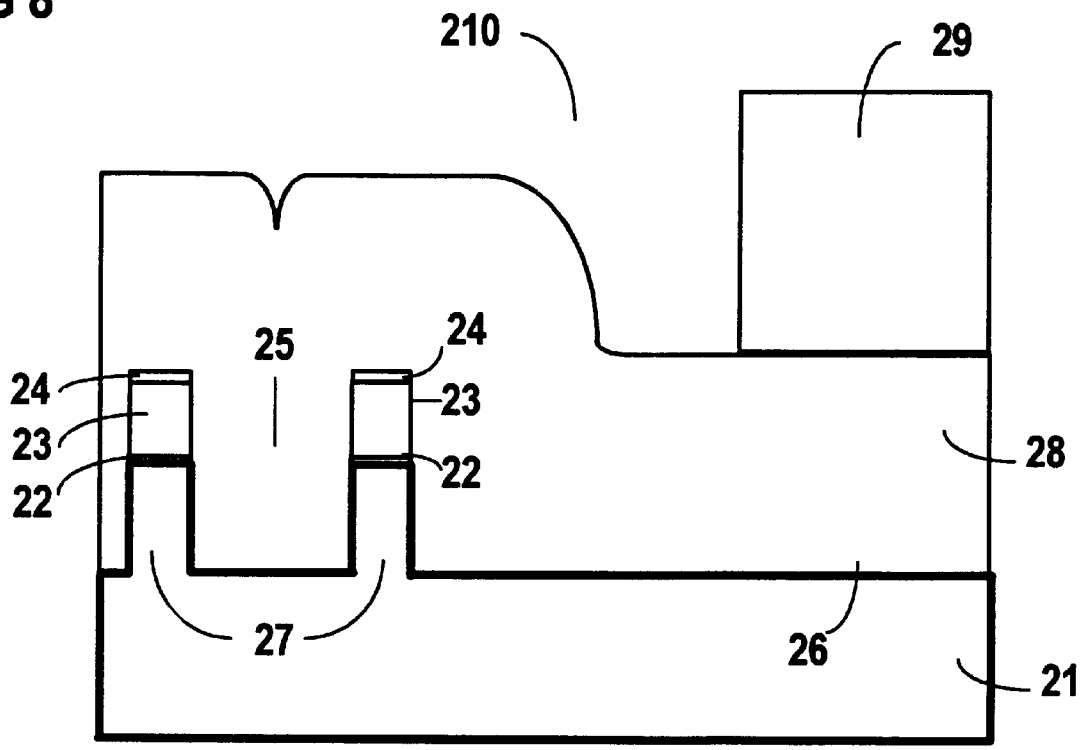
FIG. 8 shows a section through the semiconductor substrate after formation of a first insulating layer with conformal edge coverage and formation of a mask.

Subsequently, a first insulating layer 28 is deposited surface-wide with conformal edge coverage. The first insulating layer 28 is formed in a layer thickness of 500 nm, for example in a TEOS process (see FIG. 8). Since the first insulating trenches 25 have a width of 0.5 $\mu$m and the second insulating trenches 26 have a width of 40 $\mu$m, the first insulating trenches 25 are filled by the first insulating layer 28. By contrast thereto, a step whose depth approximately corresponds to the thickness of the first insulating layer 28 forms in the region of the second insulating trenches 26.

A mask 29 is formed at the surface of the first insulating layer 28 with the assistance of photolithographic process steps. The mask 29 has openings 210 that are arranged above the first insulating trenches 25 and above the active zones 27. Neighboring openings 210 thereby coincide. The openings 210 that are arranged above the active zones 27 project laterally beyond the active zones 27.

When a first insulating trench 13 neighbors the active zone, then the opening 210 arranged above the active zone 27 coincides with the openings 210 arranged above the first insulating trench 25. When, by contrast, the active zone 27 is neighbored by a second insulating trench 26, then the opening 210 projects into the region of the second insulating trench 26. The amount by which the opening 210 overlaps the active zone 27 in the region of the second insulating trench 26 that neighbors the active zone 27 is dependent on various process parameters, for example, the lithography employed, the alignment precision, the depth of the insulating trenches 25, 26, etc. This amount is preferably selected at least as large as the layer thickness of the first insulating layer 28.

Figure 9:
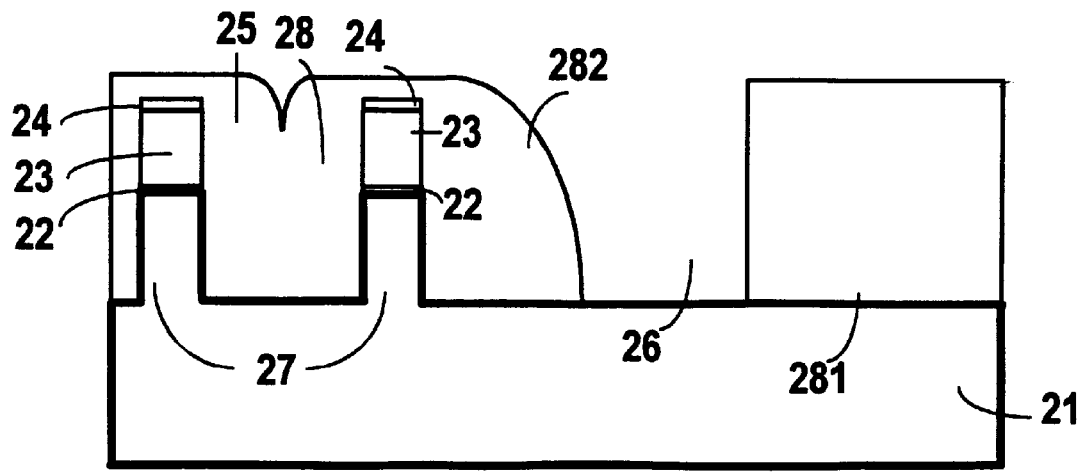
FIG. 9 shows a section through the semiconductor substrate after structuring of the first insulating layer for the formation of supporting structures and spacers.

The first insulating layer 28 is subsequently structured by anisotropic dry-etching selectively relative to the mask 29 and to the substrate 21. Supporting structures 281 are thus formed within the second insulating trenches 26 and spacers 282 are thus formed at the sidewalls of the second insulating trenches 26 (see FIG. 9). The first insulating trenches 25 remain filled with the first insulating layer 28. The etching is interrupted as soon as the surface of the substrate 21 is uncovered in the region of the second insulating trenches 26. The mask 29 is subsequently removed, for example wet-chemically.

Figure 10:
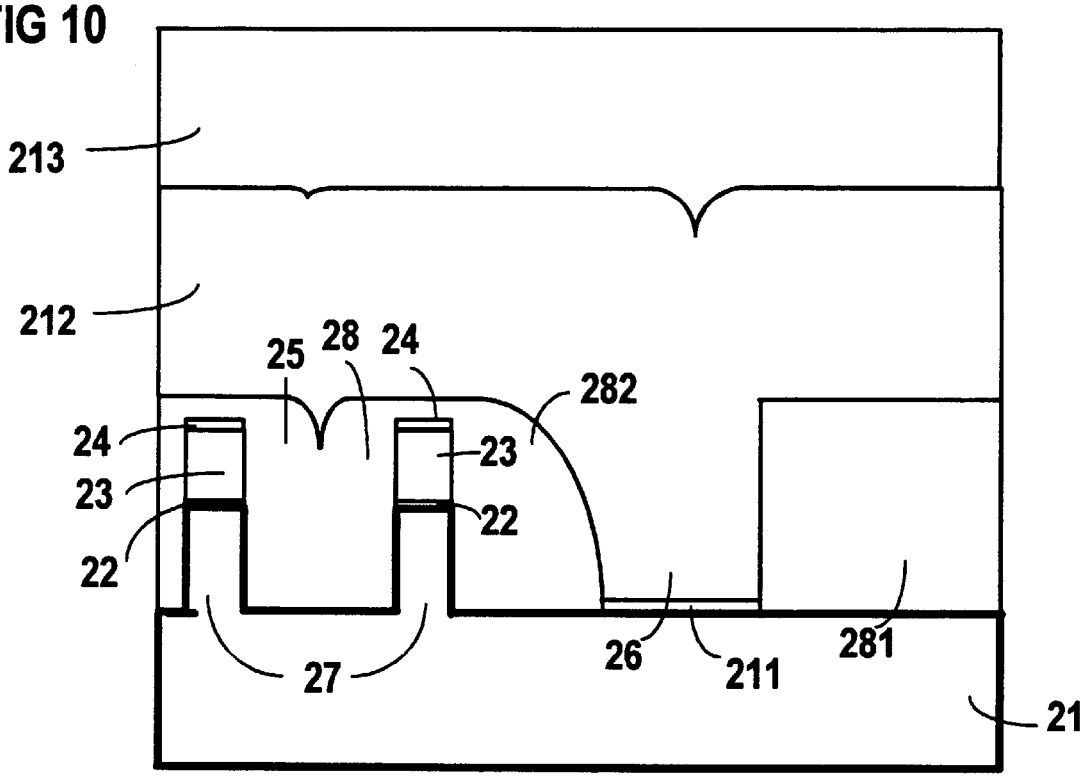
FIG. 10 shows a section through the semiconductor substrate after formation of a second insulating layer with a planar surface that comprises a planarizing $SiO_2$ layer and a planarizing photoresist layer.

A thermal oxidation is subsequently implemented, whereby a $SiO_2$ structure 211 having a thickness of, for example, 20 nm is formed at the uncovered surface of the substrate 21 in the region of the second insulating trenches 26 (see FIG. 10).

Subsequently, a planarizing $SiO_2$ layer 212 is formed surface-wide. For that purpose, a flowable $SiO_2$ is deposited and is flowed in a tempering process at approximately 950° C. For example, the planarizing $SiO_2$ layer 212 is formed of silicate glass, for example borophosphorous silicate glass, phosphorous silicate glass or borosilicate glass or of a flowable oxide as distributed by Dow Corning under the name FOX™. The planarizing $SiO_2$ layer 212 can still exhibit slight irregularities in its surface after the flowing.

The planarizing $SiO_2$ layer 212 is formed in such a thickness that the second insulating trenches 26 are completely filled by the planarizing $SiO_2$ layer 212 above the $SiO_2$ structure 211. The planarizing $SiO_2$ layer 212 is deposited, for example, in a layer thickness of 600 nm.

Subsequently, a planarizing lacquer layer 213 that compensates the irregularities remaining in the surface of the planarizing layer $SiO_2$ is formed surface-wide. Together, the planarizing $SiO_2$ layer and the planarizing lacquer layer 213 form a second insulating layer with a planar surface. The planarizing lacquer layer 213 is preferably formed of a lacquer having a great planarization length in a range of up to 200 nm. For example, the lacquer Accuflo of the Allied Signal company is suitable as the planarizing lacquer.

Figure 11:
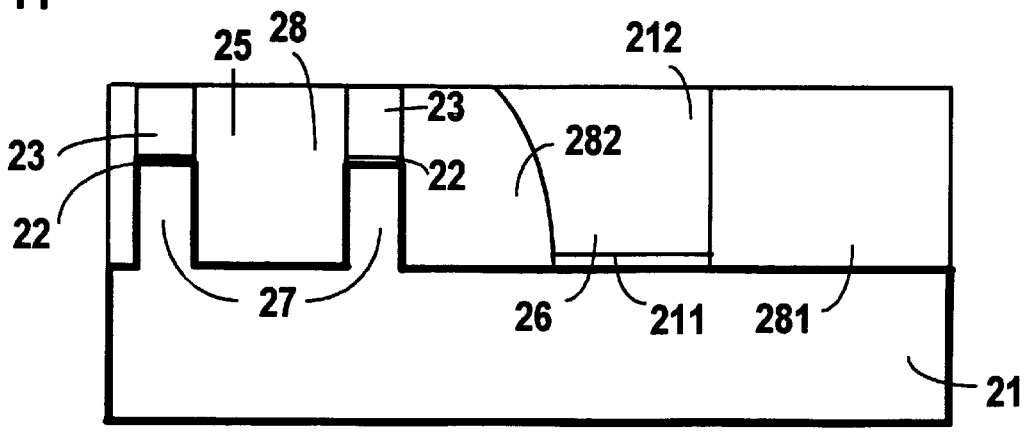
FIG. 11 shows a section through the semiconductor substrate after a planarizing layer erosion wherein the surface of the first electrode layer is uncovered.

A planarizing layer erosion is subsequently implemented in an anisotropic dry-etching process that attacks the planarizing lacquer layer 213, the planarizing $SiO_2$ layer 212 and the first insulating layer 28 with the same etching rate, for example, with a $CHF_3/NF_3/Ar$ plasma. The dry-etching process is continued until the surface of the first electrode layer 23 is uncovered (see FIG. 11). Since the surface of the first electrode layer 23 is arranged approximately 200 nm above the gate dielectric 22 and the surface of the active zones 27, tolerances in the range of 150–170 nm can thereby be accepted. An insulating fill with a planar surface is thereby formed both in the first insulating trenches 25 as well as in the second insulating trenches 26. In the second insulating trenches 26, the insulating fill comprises, among other things, the spacers 282, the supporting structures 281 that arose due to structuring of the first insulating layer 28, as well as the $SiO_2$ layer 211, and the planarizing $SiO_2$ layer 212. In the first insulating trenches 25, the insulating fill comprises mainly material of the first insulating layer 28.

Figure 12:
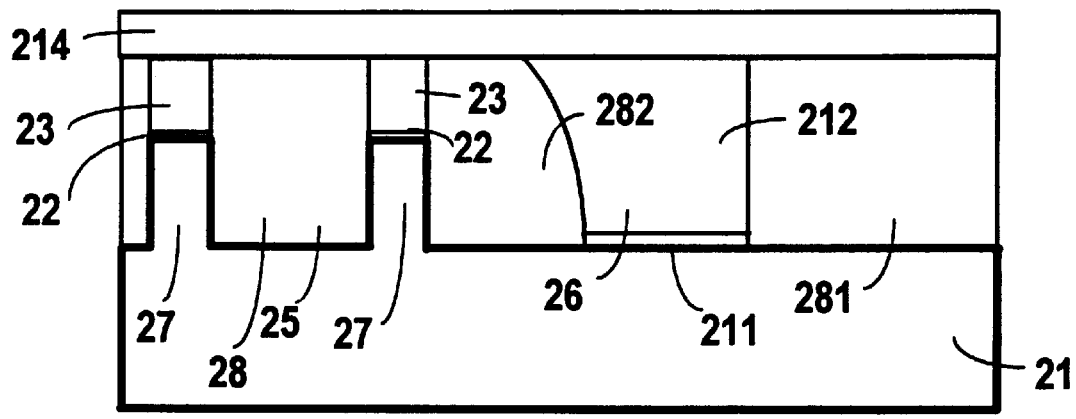
FIG. 12 shows a section through the semiconductor substrate after formation of a second electrode layer.

Subsequently, a second electrode layer 214 is applied surface-wide (see FIG. 12). The second electrode layer 214 is formed of conductive material, for example of tungsten, doped polysilicon, another metal metall silicide, TiN or of a layer combination of metal and silicon, TiN and silicon or a thin dielectric ($SiO_2$ or $Si_3N_4$) and doped silicon.

Figure 13:
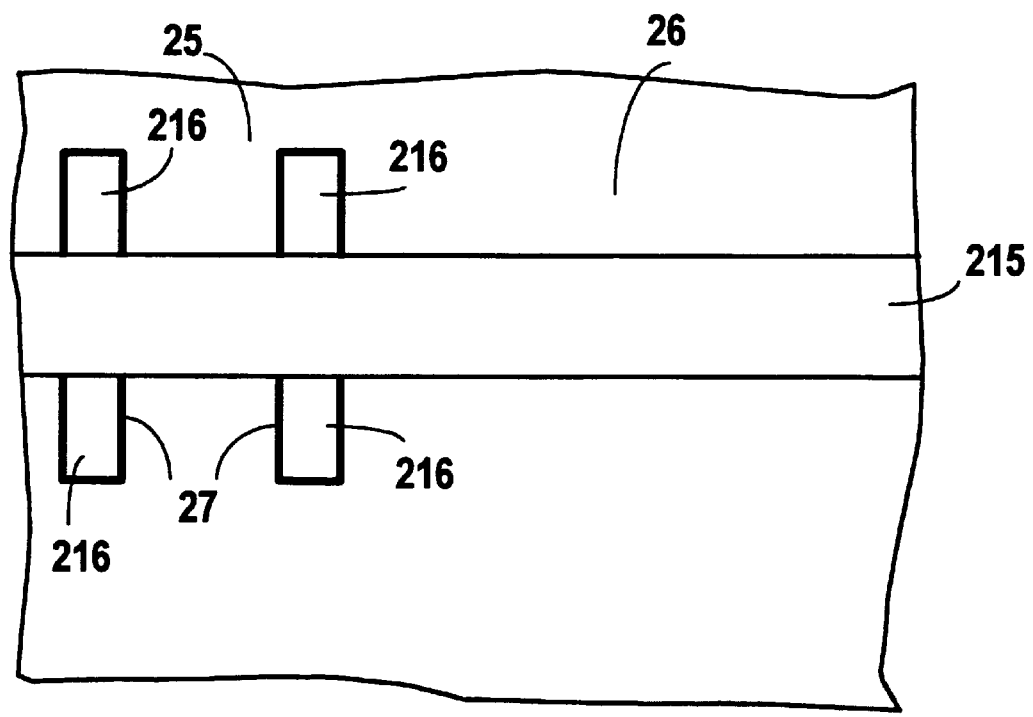
FIG. 13 shows a plan view onto the semiconductor substrate after structuring of the second electrode layer, and the structured, first electrode layer and after formation of source/drain zones.

Upon employment of a common mask and of an anisotropic dry-etching process, the second electrode layer 214 and the structured, first electrode layer 23 are subsequently structured. A line level 215 is thereby formed of the second electrode layer 214 (see the plan view in FIG. 13). Gate electrodes under the line level 215 arise from the first electrode layer 23. The line level 215 thereby connects gate electrodes that are arranged in different active zones 27.

Subsequently, insulating spacers (not shown) are formed in a known way at the sidewalls of the line level 215 and of the gate electrodes. Source/drain zones 216 that, together with the gate dielectric 22 and the corresponding gate electrode, form MOS transistors formed in the active zones 27 by implantation.

The integrated circuit is finished by deposition of an intermediate oxide, by opening via holes and by forming metallizations in a known way.

When gate electrodes with different dopings are to be formed in the integrated circuit arrangement, for example in a CMOS circuit in dual-gate technology, then the first electrode layer 23 is locally doped upon employment of one or more additional masks before the deposition of the second electrode layer 214, and preferably after the structuring.

Although the present invention has been described with reference to specific embodiments, those of skill in the art will recognize that changes may be made thereto without departing from the scope and spirit of the invention as set forth in the appended claims.

I claim as my invention:

1. A method for manufacturing an integrated circuit arrangement, comprising the steps of:

etching at a principal surface of a semiconductor substrate a first insulating trench and a second insulating trench so as to define active regions, the first insulating trench having less of a width than a width of the second insulating trench;

forming a first insulating layer with substantially conformal edge coverage to substantially fill the first insulating trench;

forming a mask that has an opening above the first insulating trench and above the active regions, the opening arranged above the active regions laterally overlapping the active regions;

structuring the first insulating layer by anisotropic etching so that a supporting structure is formed above the second insulating trench and such that a spacer is formed at a sidewall of the second trench;

removing the mask;

forming a second insulting layer having a substantially planar surface over the structured first insulating layer; and uncovering said principal surface at a top of the active regions by a planarizing layer erosion.

2. A method for manufacturing an integrated circuit arrangement, comprising the steps of:

etching at a principal surface of a semiconductor substrate a first insulating trench and a second insulating trench so as to define active regions, the first insulating trench having less of a width than a width of the second insulating trench;

forming a first insulating layer with substantially conformal edge coverage to substantially fill the first insulating trench;

forming a mask that has an opening above the first insulating trench and above the active regions, the opening arranged above the active regions laterally overlapping the active regions, and wherein the opening of the mask laterally overlaps the active regions by a distance that is at least as great as a thickness of the first insulating layer;

structuring the first insulating layer by anisotropic etching so that a supporting structure is formed above the second insulating trench and such that a spacer is formed at a sidewall of the second trench;

removing the mask:

forming a second insulting layer having a substantially planar surface over the structured first insulating layer; and uncovering said principal surface at a top of the active regions by a planarizing layer erosion.

3. A method for manufacturing an integrated circuit arrangement, comprising the steps of:

etching at a principal surface of a semiconductor substrate a first insulating trench and a second insulating trench so as to define active regions, the first insulating trench having less of a width than a width of the second insulating trench;

forming a first insulating layer with substantially conformal edge coverage to substantially fill the first insulating trench;

forming a mask that has an opening above the first insulating trench and above the active regions, the opening arranged above the active regions laterally overlapping the active regions;

structuring the first insulating layer by anisotropic etching so that a supporting structure is formed above the second insulating trench and such that a spacer is formed at a sidewall of the second trench;

removing the mask;

forming a second insulting layer having a substantially planar surface over the structured first insulating layer; and uncovering said principal surface at a top of the active regions by a planarizing layer erosion which occurs by anisotropic dry etching.

4. The method according to claim 1, including the steps of:

forming a gate dielectric and a first electrode layer on the principal surface of the semiconductor substrate before the etching of the first insulating trench and the etching of the second insulating trench;

structuring the gate dielectric and the first electrode layer in the etching of the first insulating trench and in the etching of the second insulating trench; and uncovering a surface of the structured, first electrode layer in the planarizing layer erosion.

5. The method according to claim 4, wherein a thermal oxidation is implemented after the etching of the first insulating trench and the etching of the second insulating trench.

6. The method according to claim 4 wherein at least one layer of flowable oxide is deposited and flowed for the formation of the second insulating layer.

7. A method for manufacturing an integrated circuit arrangement, comprising the steps of:

forming a gate dielectric and a first electrode layer on a principal surface of a semiconductor substrate by etching at the principal surface of the semiconductor substrate a first insulating trench and a second insulating trench so as to define active regions, the first insulating trench having less of a width than a width of the second insulating trench and structuring the gate dielectric and the first electrode layer in the etching of the first insulating trench and in the etching of the second insulating trench;

forming a first insulating layer with substantially conformal edge coverage to substantially fill the first insulating trench;

forming a mask that has an opening above the first insulating trench and above the active regions, the opening arranged above the active regions laterally overlapping the active regions;

structuring the first insulating layer by anisotropic etching so that a supporting structure is formed above the second insulating trench and such that a spacer is formed at a sidewall of the second trench;

removing the mask;

forming a second insulating layer having a substantially planar surface over the structured first insulating layer;

uncovering said principal surface at a top of the active regions by a planarizing layer erosion;

forming a second electrode layer after the planarizing layer erosion;

structuring the second electrode layer and the first electrode layer by use of a common mask so that gate electrodes are formed of the first electrode layer and a line level that comprises gate lines between gate electrodes is formed from the second electrode layer; and forming source/drain zones that form a respective MOS transistor together with each of the gate electrodes.

8. The method according to claim 7, including the steps of:

forming at least one n-channel MOS transistor and one p-channel MOS transistor that have differently doped gate electrodes; and differently doping the structured first electrode layer before the formation of the second electrode layer for different doping of the gate electrodes.

9. The method according to claim 7 including the steps of:

forming the first insulating layer of $SiO_2$;

forming the first electrode layer of doped polysilicon;

providing the second electrode layer with at least one of the materials, doped silicon, metal silicide, metal and/or an organic conductor; and providing the semiconductor substrate as a monocrystalline silicon at least in a region of the principal surface thereof.

10. A method for manufacturing an integrated circuit arrangement, comprising the steps of:

etching at a principal surface of a semiconductor substrate a first insulating trench and a second insulating trench so as to define active regions;

forming a first insulating layer with substantially conformal edge coverage to substantially fill the first insulating trench;

forming a mask that has an opening above the first insulating trench and above the active regions;

structuring the first insulating layer by etching so that a supporting structure is formed above the second insulating trench and such that a spacer is formed at a sidewall of the second trench;

removing the mask;

forming a second insulting layer over the structured first insulating layer; and uncovering at a top of the active regions by a planarizing layer erosion.

* * * * *